United States Patent
Jin et al.

(10) Patent No.: US 11,106,559 B2
(45) Date of Patent: Aug. 31, 2021

(54) MEMORY CONTROLLER AND MEMORY SYSTEM INCLUDING THE MEMORY CONTROLLER

(71) Applicant: SK hynix Inc., Icheon-si (KR)

(72) Inventors: Young Jae Jin, Seoul (KR); Joo Young Kim, Icheon-si (KR); Yong Sang Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 53 days.

(21) Appl. No.: 16/659,129

(22) Filed: Oct. 21, 2019

(65) Prior Publication Data
US 2020/0250060 A1   Aug. 6, 2020

(30) Foreign Application Priority Data
Feb. 1, 2019   (KR) .................. 10-2019-0013293

(51) Int. Cl.
| | |
|---|---|
| *G06F 12/00* | (2006.01) |
| *G06F 11/30* | (2006.01) |
| *G11C 11/408* | (2006.01) |
| *G06F 9/48* | (2006.01) |
| *G11C 11/409* | (2006.01) |
| *G06F 13/16* | (2006.01) |

(52) U.S. Cl.
CPC ........ *G06F 11/3058* (2013.01); *G06F 9/4881* (2013.01); *G06F 11/3037* (2013.01); *G06F 13/1689* (2013.01); *G11C 11/409* (2013.01); *G11C 11/4087* (2013.01)

(58) Field of Classification Search
CPC ............. G06F 11/3058; G06F 11/3037; G06F 9/4881; G06F 13/1689; G11C 11/4087; G11C 11/409
See application file for complete search history.

(56) References Cited

U.S. PATENT DOCUMENTS

2016/0320971 A1*  11/2016  Postavilsky ........... G06F 3/0659
2017/0177045 A1   6/2017  Seo et al.

FOREIGN PATENT DOCUMENTS

KR   1020190122057 A   10/2019

* cited by examiner

*Primary Examiner* — Shawn X Gu
(74) *Attorney, Agent, or Firm* — William Park & Associates Ltd.

(57) ABSTRACT

A memory controller includes a temperature monitor configured to update temperature states of a memory device divided into groups as temperature scores and a scheduler configured to update a command score using the temperature scores and change a priority of the command score to match with a current operation mode.

15 Claims, 11 Drawing Sheets

FIG.7

| CMD ID | TO | HTS | MTS | LTS | HP | STRV |
|--------|----|----|----|----|----|------|

COMMAND SCORE TABLE

FIG.9

TEMPERATURE SCORE TABLE

| HLMG | MLMG | LLMG | CNT |
|---|---|---|---|
| HLMG1 | MLMG1 | LLMG1 | CNT# |
| | | LLMG2 | CNT# |
| | | LLMG3 | CNT# |
| | | LLMG4 | CNT# |
| | | LLMG5 | CNT# |
| | | LLMG6 | CNT# |
| | | LLMG7 | CNT# |
| | | LLMG8 | CNT# |
| | MLMG2 | LLMG1 | CNT# |
| | | LLMG2 | CNT# |
| | | LLMG3 | CNT# |
| | | LLMG4 | CNT# |
| | | LLMG5 | CNT# |
| | | LLMG6 | CNT# |
| | | LLMG7 | CNT# |
| | | LLMG8 | CNT# |
| | MLMG3 | LLMG1 | CNT# |
| | | LLMG2 | CNT# |
| | | LLMG3 | CNT# |
| | | LLMG4 | CNT# |
| | | LLMG5 | CNT# |
| | | LLMG6 | CNT# |
| | | LLMG7 | CNT# |
| | | LLMG8 | CNT# |
| | MLMG4 | LLMG1 | CNT# |
| | | LLMG2 | CNT# |
| | | LLMG3 | CNT# |
| | | LLMG4 | CNT# |
| | | LLMG5 | CNT# |
| | | LLMG6 | CNT# |
| | | LLMG7 | CNT# |
| | | LLMG8 | CNT# |
| HLMG2 | MLMG1-4 | LLMG-8 | CNT# |
| HLMG3 | MLMG1-4 | LLMG1-8 | CNT# |
| HLMG4 | MLMG1-4 | LLMG1-8 | CNT# |

↓
HTS, MTS, LTS

MEMORY CONTROLLER AND MEMORY SYSTEM INCLUDING THE MEMORY CONTROLLER

CROSS-REFERENCES TO RELATED APPLICATION

The present application claims priority under 35 U.S.C. § 119(a) to Korean application number 10-2019-0013293, filed on Feb. 1, 2019, in the Korean Intellectual Property Office, which is incorporated herein by reference in its entirety.

BACKGROUND

1. Technical Field

Various embodiments may generally relate to a semiconductor circuit, and more particularly, to a memory controller and a memory system including the memory controller.

2. Related Art

The memory system may include a memory device in which data is to be stored and a memory controller configured to control the memory device.

Memory devices may include nonvolatile memory devices whereby their data is retained even when a power supply is interrupted and volatile memory devices whereby their data is not retained when a power supply is interrupted. The memory devices may be configured of the nonvolatile memory devices or the volatile memory devices according to the memory systems.

The memory controller may perform communication between a host and the memory device. For example, when the requests are received from the host, the memory controller may control the memory device to perform the received requests. For example, when a write request is received from the host, the memory controller may generate a write command for controlling the memory device and sequentially transmit the write command and data received from the host to the memory device. When a read request and a logical address are received from the host, the memory controller may generate a read command for controlling the memory device and sequentially transmit the read command and a physical address corresponding to the logical address.

The memory device may include a plurality of memory cells with large capacity and high integration and thus the heat phenomenon that a temperature in a specific region of the memory device is increased may be caused. The heat may degrade the performance and reduce the lifespan of the memory device and thus deteriorate the reliability of the memory system. Therefore, there is a need for preventing the heat from being concentrated within a specific region of the memory device.

SUMMARY

In an embodiment of the present disclosure, a memory controller may include: a temperature monitor configured to update temperature states of a memory device divided into groups as temperature scores; and a scheduler configured to update a command score using the temperature scores and change a priority of the command score to match with a current operation mode.

In another embodiment of the present disclosure, a memory controller may include: a host interface configured to receive requests from a host and output data read from a memory device to the host; and a command/address controller configured to update temperature states of the memory device and change an order in which commands are to be issued and provided to the memory device according to the temperature states and a currently set operation mode when the requests are received.

BRIEF DESCRIPTION OF THE DRAWINGS

FIG. 7 is a diagram illustrating a configuration of a command score table according to an embodiment of the present disclosure;

FIG. 9 is a diagram illustrating a configuration of a temperature score table of FIG. 8;

DETAILED DESCRIPTION

Various embodiments will be described with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the disclosure.

The embodiments are described herein with reference to cross-section and/or plan illustrations. However, embodiments should not be construed as limiting the concepts. Although a few embodiments will be shown and described, it will be appreciated by those of ordinary skill in the art that changes may be made in these embodiments without departing from the principles and spirit of the disclosure.

Embodiments may be provided to a memory controller capable of efficiently scheduling commands by considering a temperature and performance of a semiconductor device and a memory system including the same.

Figure 1:
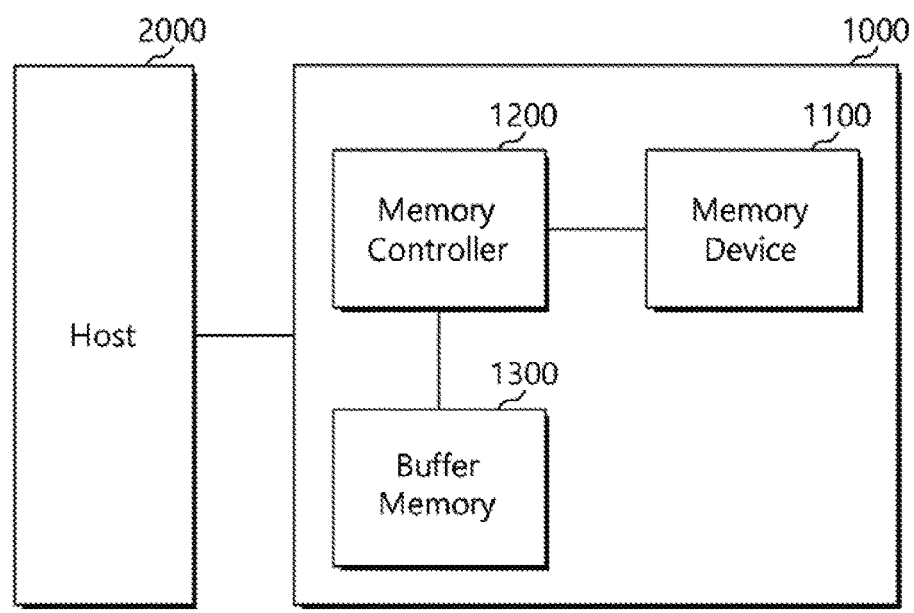
FIG. 1 is a diagram illustrating a configuration of a memory system according to an embodiment of the present disclosure.

FIG. 1 is a diagram illustrating a configuration of a memory system according to an embodiment of the present disclosure.

As illustrated in FIG. 1, a memory system 1000 according to an embodiment includes a memory device 1100 in which data is to be stored and a memory controller 1200 which performs communication between a host 2000 and the memory device 1100.

The memory device 1100 may be configured of a nonvolatile memory device that data is retained even when power supply is interrupted and a volatile memory device that data is not retained when power supply is interrupted.

The memory device 1100 may include a plurality of memory cells in which data are to be stored and the memory cells may be divided into various group units.

The memory device 1100 may include, for example, at least one or more high-level memory groups, the high-level memory group may include one or more middle-level memory groups, and the middle-level memory group may include one or more low-level memory groups.

A buffer memory 1300 may be further included in the memory system 1000. The buffer memory 1300 may be used to temporarily store system data for controlling data exchange between the host 2000 and the memory device 1100 or controlling the memory device 1100.

The buffer memory 1300 may be used as a working memory or a cache memory of the memory controller 1200. The buffer memory 1300 may temporarily store codes and commands which are to be executed by the memory controller 1200.

The buffer memory 1300 may include any one of a double data rate synchronous dynamic random access memory (DDR SDRAM), a DDR4 SDRAM, a low power double data date (LPDDR) SDRAM, a LPDDR4 SDRAM, a graphics double data rate (GDDR) SDRAM, a Rambus dynamic random access memory (RDRAM), and the like.

The host 2000 may communicate with the memory system 1000 using at least one among various communication methods such as universal serial bus (USB), serial advanced technology attachment (SATA), small computer system interface (SCSI), serial attached SCSI (SAS), high speed interchip (HSIC), peripheral component interconnection (PCI), PCI express (PCI-E), nonvolatile memory express (NVMe), universal flash storage (UFS), secure digital (SD), multimedia card (MMC), embedded MMC (eMMC), dual in-line memory module (DIMM), registered DIMM (RDIMM), load reduced DIMM (LRDIMM).

The memory controller 1200 may control an overall operation of the memory system 1000 and control data exchange between the host 2000 and the memory device 1100.

The memory controller 1200 may temporarily store data input from the host 2000. The memory controller 1200 may transmit the data temporarily stored in the buffer memory 1300 to and in the memory device 1100.

The memory controller 1200 may receive data and a logical address from the host 2000 and convert the logical address into a physical address of the memory device 1100.

The memory controller 1200 may store logical-physical address mapping information constituting a mapping relation between the logical address and the physical address in the buffer memory 1300.

The memory controller 1200 may generate temperature scores by updating temperature states according to groups of the memory device 1100, for example, the high-level memory group, the middle-level memory group, and the low-level memory group in real time and adjust an issue order of commands according to a command score including the generated temperature scores.

The memory controller 1200 may change a priority of the command score, for example, a priority of detailed items of the command score according to an operation mode.

For example, the memory system 1000 according to an embodiment may operate with a first operation mode (for example, a low temperature mode: hereinafter, referred to as 'LT') or a second operation mode (for example, short latency mode: hereinafter, referred to as 'SL').

The first operation mode LT may be an operation mode of which the top priority is to drop a temperature of the memory device 1100, for example, an operation mode of which the top priority is a stable operation of the memory device 1100.

The second operation mode SL may be an operation mode of which the top priority is an operation speed (performance) of the memory device 1100.

Figure 2:
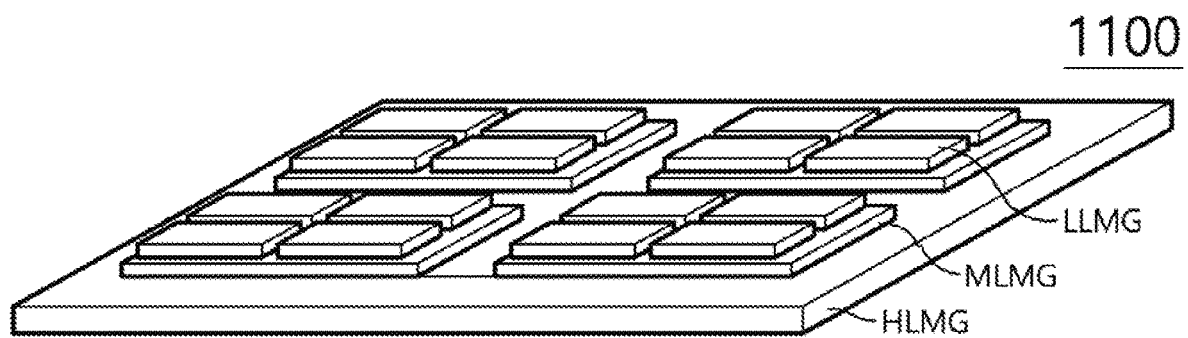
FIG. 2 is a diagram illustrating a configuration of a memory device in FIG. 1.

FIG. 2 is a diagram illustrating a configuration example of the memory device of FIG. 1.

As illustrated in FIG. 2, the memory device 1100 according to an embodiment may include at least one or more high-level memory groups HLMG, the high-level memory group HLMG may include one or more middle-level memory groups MLMG, and the middle-level memory group MLMG may include one or more lower-level memory groups LLMG.

The low-level memory group LLMG may include a plurality of memory cells.

The high-level memory group HLMG, the middle-level memory group MLMG, and the low-level memory group LLMG may be arranged in different layers from each other and divided and managed by addresses different from each other.

The high-level memory group HLMG, the middle-level memory group MLMG, and the low-level memory group LLMG may be merely named to divide storage regions of the memory device 1100 and thus the names of the storage regions may be variously represented with ranks, slices, channels, planes, bank groups, banks, and the like. The example that the storage regions are divided into the high-level memory group HLMG, the middle-level memory group MLMG, and the low-level memory group LLMG will be described below in an embodiment, but these are merely examples and the names of the storage regions are not limited thereto.

For example, the high-level memory group HLMG may refer to a rank, a slice, a channel, or a plain, the middle-level memory group MLMG may refer to a bank group, and the low-level memory group LLMG may refer to a bank.

Figure 3:
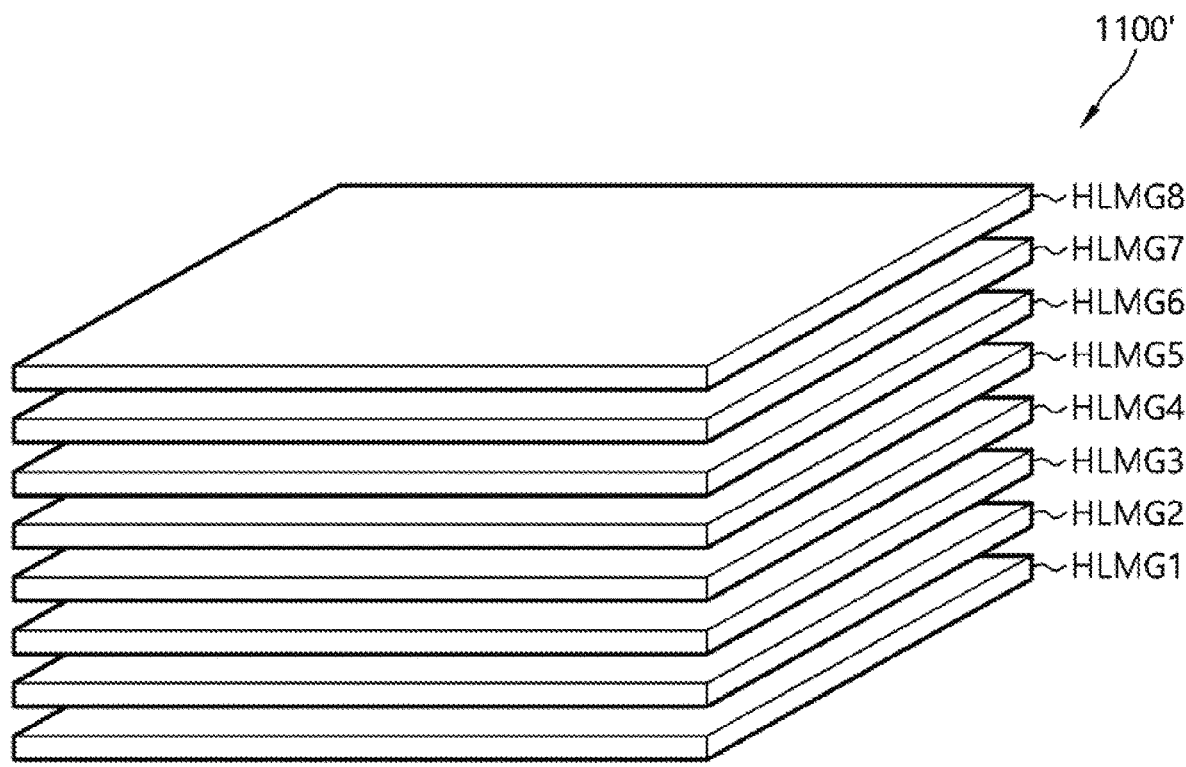
FIG. 3 is a diagram illustrating a configuration of a memory device having a multi-stack structure according to an embodiment of the present disclosure.

FIG. 3 is a diagram illustrating a configuration of a memory device having a multi stack structure according to an embodiment.

Referring to FIG. 3, the memory device 1100' having the multi stack structure according to an embodiment may include a plurality of high-level memory groups HLMG stacked, for example, first to eighth high-level memory groups HLMG1 to HLMG8.

Each of the first to eight high-level memory groups HLMG1 to HLMG8 may include at least one middle-level memory group MLMG and at least one low-level memory group LLMG as described with reference to FIG. 2.

Figure 4:
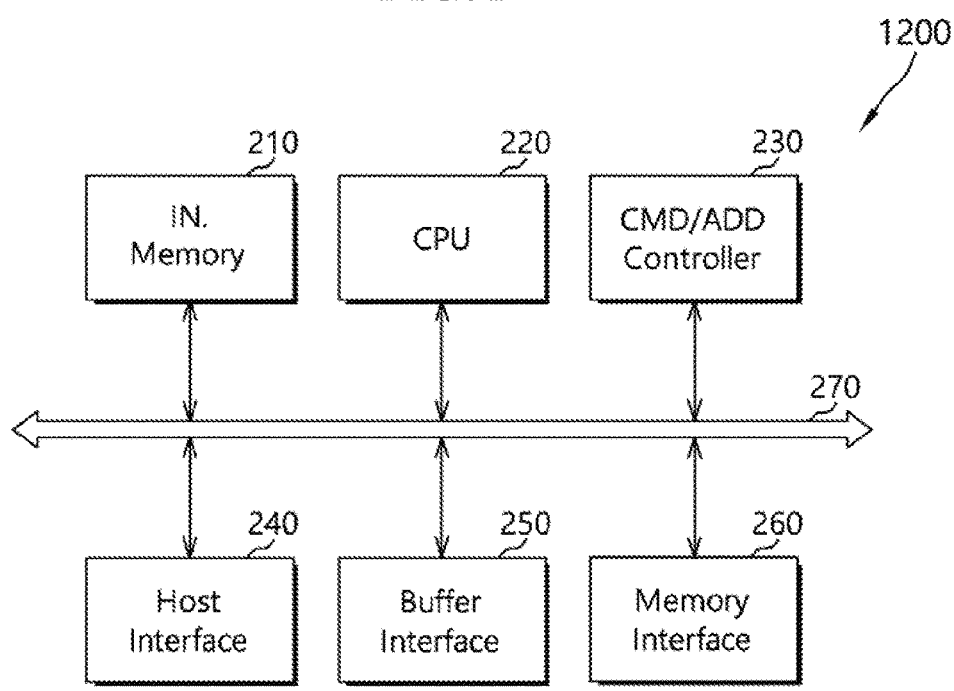
FIG. 4 is a diagram illustrating a configuration of a memory controller of FIG. 1.

FIG. 4 is a diagram illustrating a configuration example of the memory controller of FIG. 1.

Referring to FIG. 4, the memory controller 1200 may include an internal memory 210, a central processing unit (CPU) 220, a command/address (CMD/ADD) controller 230, a host interface 240, a buffer interface 250, and a memory interface 260.

The internal memory 210 may store various system information required for an operation of the memory controller 1200. The internal memory 210 may store address mapping information, debugging information, and the like required for an operation of the memory system 1000 in addition to the system information. For example, the internal memory 210 may be implemented with a SRAM.

The CPU 220 may perform various arithmetic operations for controlling the memory device 1100 or drive firmware. The CPU 220 may transmit requests received from the host 2000 to the command/address controller 230. The CPU 220 may control overall operations of the internal memory 210, the command/address controller 230, the host interface 240, the buffer interface 250, and the memory interface 260.

The host interface 240 may be configured to communicate with the host 2000 connected to the memory system 1000 according to control of the CPU 220.

When the buffer memory 1300 is arranged in the outside of the memory controller 1200, the buffer interface 250 may transmit information to the buffer memory 1300 or information stored in the buffer memory 1300 to the CPU 220, according to control of the CPU 220.

The memory interface 260 may be configured to communicate with the memory device 1100 according to control of the CPU 220. For example, the memory interface 2600 may transmit a command, an address and data to the memory device 1100 and transmit data read from the memory device 1100 to the CPU 220, according to control of the CPU 220.

The CPU 220 may transmit data between internal function blocks of the memory controller 1200, such as the internal memory 210, the command/address controller 230, the host interface 240, the buffer interface 250, and the memory interface 260, through a bus 270.

The command/address controller 230, the host interface 240, and the memory interface 260 may communicate with each other independently of the bus 270.

For example, the command/address controller 230 and the host interface 240 may directly communicate with each other independently of the bus 270. The command/address controller 230 and the memory interface 260 may also directly communicate with each other independently of the bus 270. The host interface 240 and the memory interface 260 may also directly communicate with each other independently of the bus 270.

The command/address controller 230 may adjust the order in which the commands are issued according to the command score. The command score includes the temperature scores.

The command/address controller 230 may change a priority of the command score, for example, a priority of detailed items within the command score to match with the first operation mode LT and the second operation mode SL.

Figure 5:
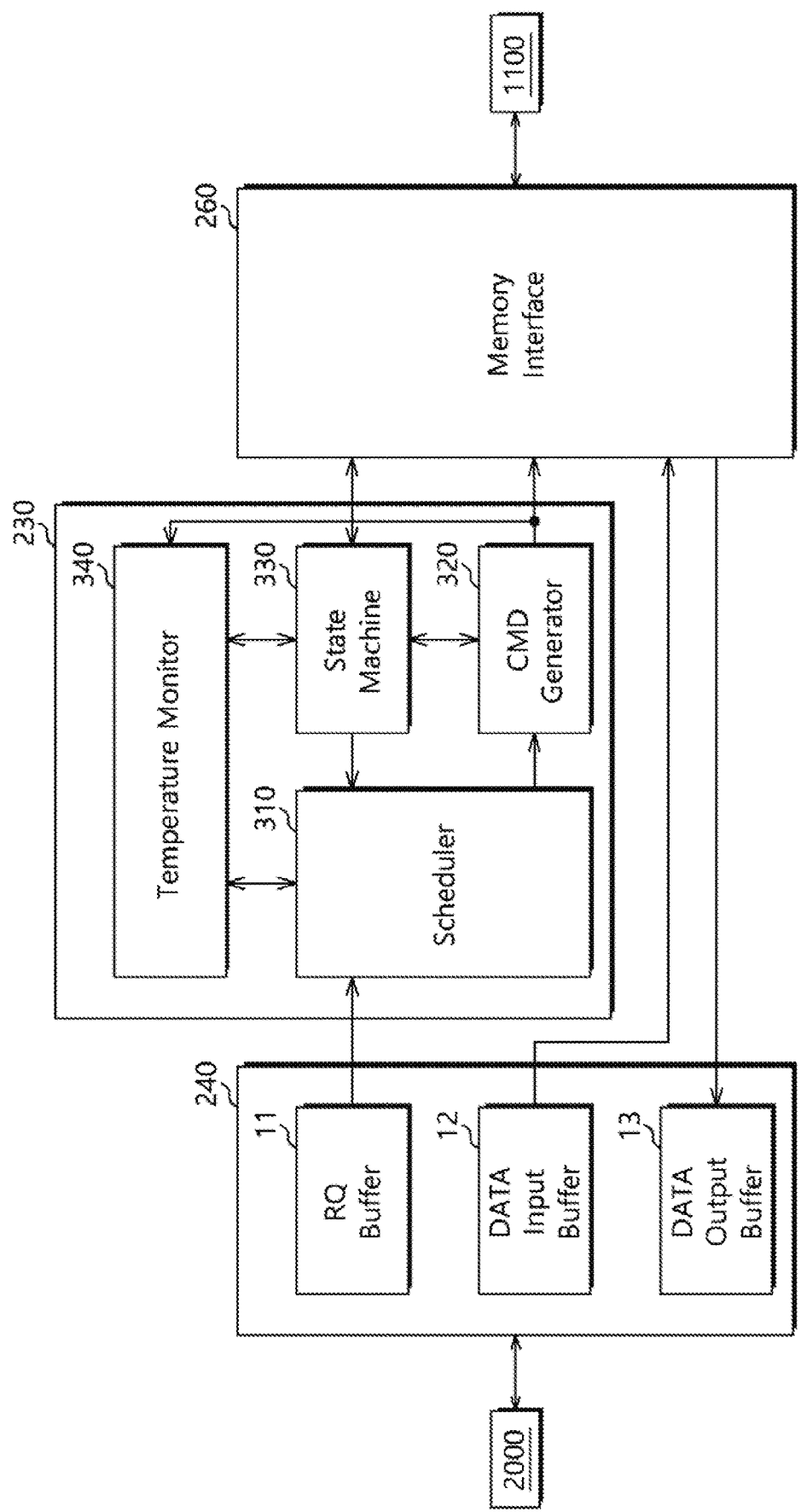
FIG. 5 is a diagram illustrating a command/address controller and a host interface of the memory controller in FIG. 4.

FIG. 5 is a diagram illustrating a command/address controller and a host interface of the memory controller in FIG. 4.

As illustrated in FIG. 5, the host interface 240 may include a request (RQ) buffer 11, a data input buffer 12, and a data output buffer 13.

The request buffer 11 may receive and temporarily store requests from the host 2000 and sequentially transmit the received requests to the memory controller 1200. For example, the request buffer 11 may sequentially transmit the temporarily stored requests to the command/address controller 230 according to control of the CPU 220, The requests received from the host 2000 may include commands and logical addresses.

The data input buffer 12 may temporarily store data received from the host 2000 and transmit the data to the memory interface 260 according to control of the CPU 220.

The data output buffer 13 may temporarily store data received from the memory interface 260 and output the received data to the host 2000 according to control of the CPU 220. For example, in a read operation, the host interface 240 may receive the data read from the memory device 1100 through the memory interface 260. When the data is transmitted from the memory interface 260 to the data output buffer 13, the data output buffer 13 may output the data to the host 2000.

The command/address controller 230 may include a scheduler 310, a command (CMD) generator 320, a state machine 330, and a temperature monitor 340.

The scheduler 310 may update its own command score using a temperature score corresponding to a logical address received from the host 2000 among temperature scores of the temperature monitor 340 and change the priority of a command score, for example, the priority of detailed items of the command score to match with a current operation mode LT or SL.

The scheduler 310 may adjust the order in which the commands with reference to state information of the memory device 1100 provided from the state machine 330 are issued.

For example, the scheduler 310 may adjust the order in which the commands are issued when the memory device 1100 cannot execute the command scheduled to the current command score according to the state information provided from the state machine 330.

The command generator 320 may receive the command score, generate a command and a physical address corresponding to the command score, and transmit the generated command and the physical address to the memory interface 260 and the temperature monitor 340. Here, the physical address may be an address received from a map table stored in the buffer memory (see 1300 of FIG. 1).

The state machine 330 may update a current operation state (for example, idle, refresh, active, read, write, power-down, and the like) of the memory device 1100 and provide the updated operation state as the state information to the scheduler 310.

The temperature monitor 340 may update a count value according to the command and physical address received from the command generator 320 in real time with respect to a group of the memory device 1100, for example, the high-level memory group HLMG, the middle-level memory group MLMG, and the low-level memory group LLMG and may store and output the updating result as the temperature score.

Figure 6:
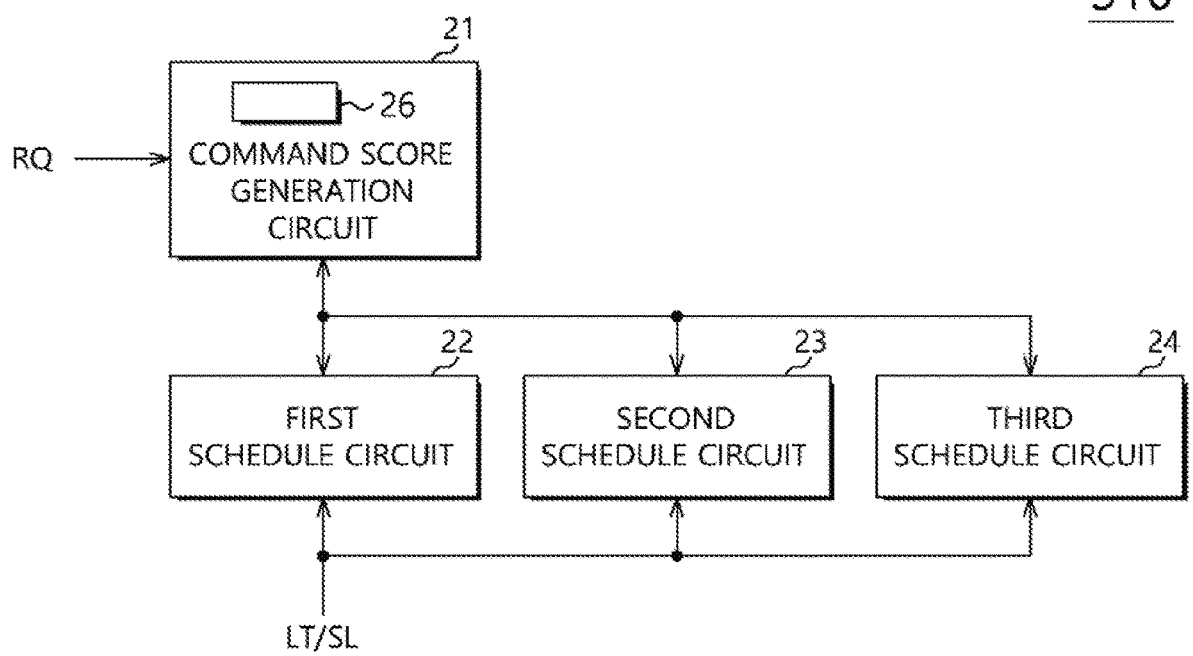
FIG. 6 is a diagram illustrating a configuration of a scheduler of FIG. 5.

FIG. 6 is a diagram illustrating a configuration of the scheduler of FIG. 5.

Referring to FIG. 6, the scheduler 310 may include a command score generation circuit 21 and a plurality of schedule circuits, for example, first to third schedule circuits 22, 23, and 24.

The command score generation circuit 21 may generate the command scores divided according to the groups of the memory devices 1100 and store the generated command scores within the command score table.

Each of the command scores of the command score table may include a temperature score.

The command score generation circuit 21 may include a counter/decoder 26.

The counter/decoder 26 may generate a count value CNT by decoding and counting the logical address included in the request RQ.

Figure 8:
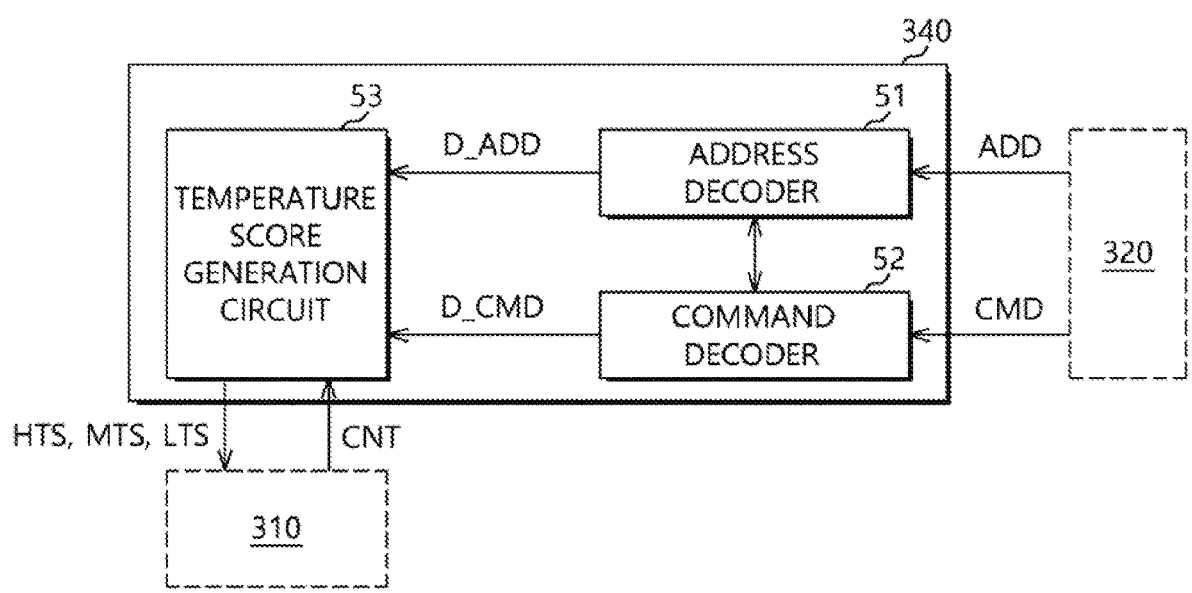
FIG. 8 is a diagram illustrating a configuration of a temperature monitor of FIG. 5.

The command score generation circuit 21 may update the command score table by reading a temperature score corresponding to a decoded address among the temperature scores (for example, a high-temperature score (HTS), a middle-temperature score (MTS), and a low-temperature score (LTS)) of a temperature score table in the temperature score generation circuit (see 53 of FIG. 8).

Among the temperature scores HTS, MTS, and LTS, the first temperature score HTS may be a temperature score corresponding to the high-level memory group HLMG corresponding to the command, the second temperature score MTS may be a temperature score corresponding to the middle-level memory group MLMG corresponding to the command, and the third temperature score LTS may be a temperature score corresponding to the low-level memory group LLMG corresponding to the command.

Each of the first to third schedule circuits 22 to 24 may issue a command corresponding to a priority of a command score changed according to the operation mode identification signal LT/SL among queued commands.

The operation mode identification signal LT/SL is a signal for determining whether the current operation mode is the first operation mode LT or the second operation mode SL. The operation mode identification signal LT/SL may be stored in at least one among the buffer memory 1300 in FIG. 1, the internal memory 210 in FIG. 4, and the state machine 330 in FIG. 5. The value of the operation mode identification signal LT/SL may be changed according to external control (for example, control by the host 2000).

The first schedule circuit 22 may issue a command according to the first temperature score HTS among the temperature scores of the command score, for example, the first to third temperature scores HTS, MTS, and LTS.

For example, when the priority of the temperature score item is the highest level among the priority levels of the detailed items constituting the command score, the first schedule circuit 22 may issue a command corresponding to the first temperature score HTS having the lowest value among the queued commands.

The second schedule circuit 23 may issue a command according to the second temperature score MTS among the temperature scores of the command score, for example, the first to third temperature scores HTS, MTS, and LTS For example, when the priority of the temperature score item is the highest level among the priority levels of the detailed items constituting the command score, the second schedule circuit 23 may issue a command corresponding to the second temperature score MTS having the lowest value among the queued commands.

The third schedule circuit 24 may issue a command according to the third temperature score LTS among the temperature scores of the command score, for example, the first to third temperature scores HTS, MTS, and LTS For example, when the priority of the temperature score item is the highest level among the priority levels of the detailed items constituting the command score, the third schedule circuit 24 may issue a command corresponding to the third temperature score LTS having the lowest value among the queued commands.

Figure 7:
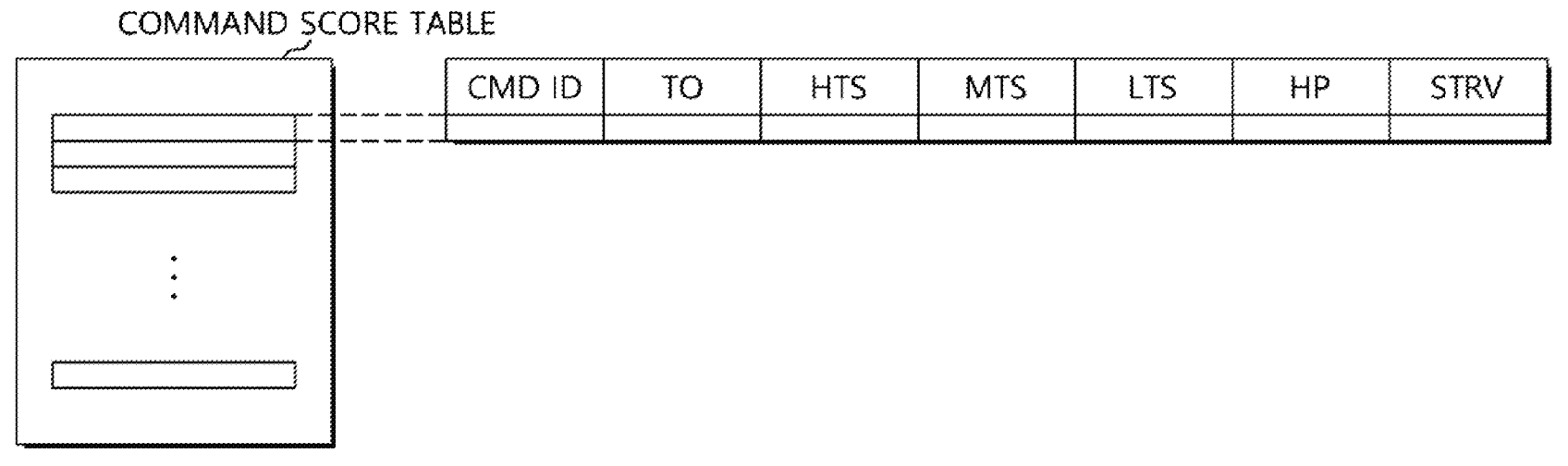

FIG. 7 is a diagram illustrating a configuration of a command score table according to an embodiment.

Referring to FIG. 7, the command score table may include a plurality of command scores.

Each of the command scores may include a plurality of detailed items, for example, command identification (ID) CMD ID, Time Out TO, first to third temperature scores HTS, MTS, and LTS, High Priority HP, and starvation STRV.

The item, command ID CMD ID, may be a unique number assigned to the commands by the host 2000.

The item, starvation STRV, may define that the issue of a corresponding command is delayed and when the value of the item, Starvation STRV, is larger than a preset value, the item, Time Out TO, may be checked. The word "preset" as used herein with respect to a parameter, such as a preset value, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The item, High Priority HP, may represent a degree suitable for a high-performance operation of the memory device according to the type of the memory device.

The priority of scheduling commands in the first operation mode LT may be TO>HTS>MTS>LTS>HP and the priority of scheduling commands in the second operation mode SL may be TO>HP. In an embodiment, the time out TO item has a greater priority than the first temperature score HTS item, the first temperature score HTS item has a greater priority than the second temperature score MTS item, the second temperature score MTS item has a greater priority than the third temperature score LTS item, and the third temperature score LTS item has a greater priority than the high priority HP item in the first operation mode LT for the scheduling of commands. In an embodiment, the time out TO item has a greater priority than the high priority HP item in the second operation mode SL for the scheduling of commands.

The example that the operation mode is divided into the first operation mode LT and the second operation mode SL has been illustrated in an embodiment. However, if necessary, a third operation mode that the first operation mode and the second operation mode are mixed may be applied as the operation mode.

The priority of scheduling commands in the third operation mode may be TO>HTS>HP or TO>HTS>MTS>HP. In an embodiment, the time out TO item has a greater priority than the first temperature score HTS item and the first temperature score HTS item has a greater priority than the high priority HP item in the third operation mode for the scheduling of commands. In an embodiment, the time out TO item has a greater priority than the first temperature score HTS item, the first temperature score HTS item has a greater priority than the second temperature score MTS item, and the second temperature score MTS item has a greater priority than the high priority HP item in the third operation mode for the scheduling of commands.

FIG. 8 is a diagram illustrating a configuration of the temperature monitor of FIG. 5.

Referring to FIG. 8, the temperature monitor 340 may include an address decoder 51, a command decoder 52, and the temperature score generation circuit 53.

The address decoder 51 may decode a physical address ADD received from the command generator 320 and output a decoding result as a decoded address D_ADD.

The decoded address D_ADD may be an address for identifying the high-level memory group HLMG, the middle-level memory group MLMG, and the low-level memory group LLMG.

The command decoder 52 may decode the command CMD received from the command generator 320 and output a decoding result as a decoded command D_CMD.

The decoded commands D_CMD may be commands for the different operations of the memory device from each other.

The temperature score generation circuit 53 may include the temperature score table in which the temperature scores are stored and may update the values of the first and third temperature scores HTS, MTS, and LTS of the high-level memory group HLMG, the middle-level memory group MLMG, and the low-level memory group LLMG according to the decoded address D_ADD, the decoded command D_CMD, and the count value CNT.

FIG. 9 is a diagram illustrating a configuration of a temperature score table according to an embodiment.

Referring to FIG. 9, the temperature score table in the temperature score generation circuit 53 may store the count values CNT of the high-level memory group HLMG, the middle-level memory group MLMG, and the low-level memory group LLMG and the stored count values CNT may be used as the first to third temperature scores HTS, MTS, and LTS of the high-level, middle-level, and low-level memory groups HLMG, MLMG, and LLMG.

For example, it is assumed that the memory device 1100 may include first to fourth high-level memory groups HLMG1 to HLMG4, each of the first to fourth high-level memory groups HLMG1 to HLMG4 may include first to fourth middle-level memory groups MLMG1 to MLMG4, and each of the first to fourth middle-level memory groups MLMG1 to MLMG4 may include first to eight low-level memory group LLMG1 to LLMG8.

The count values CNT may be updated with respect to the first to eighth low-level memory groups LLMG1 to LLMG8. For example, the count value CNT of the first low-level memory group LLMG1 of the first middle-level memory group MLMG1 of the first high-level memory group HLMG1 may be increased according to the decoded command D_CMD. The decoded address D_ADD may select an update-target address and a heat degree of a memory group corresponding to the update-target address may be determined according to the decoded command D_CMD. For example, it is assumed that the heat generated in performing of a write operation is larger than the heat generated in performing of a read operation. When the decoded command D_CMD is a command corresponding to the write operation, the count value CNT may be relatively largely increased and when the decoded command D_CMD is a command corresponding to the read operation, the count value CNT may be relatively less increased.

For example, the increase in a value that the count values of the low level memory group to the high level memory group are added may mean that the temperature of a corresponding memory group is high.

Figure 10:
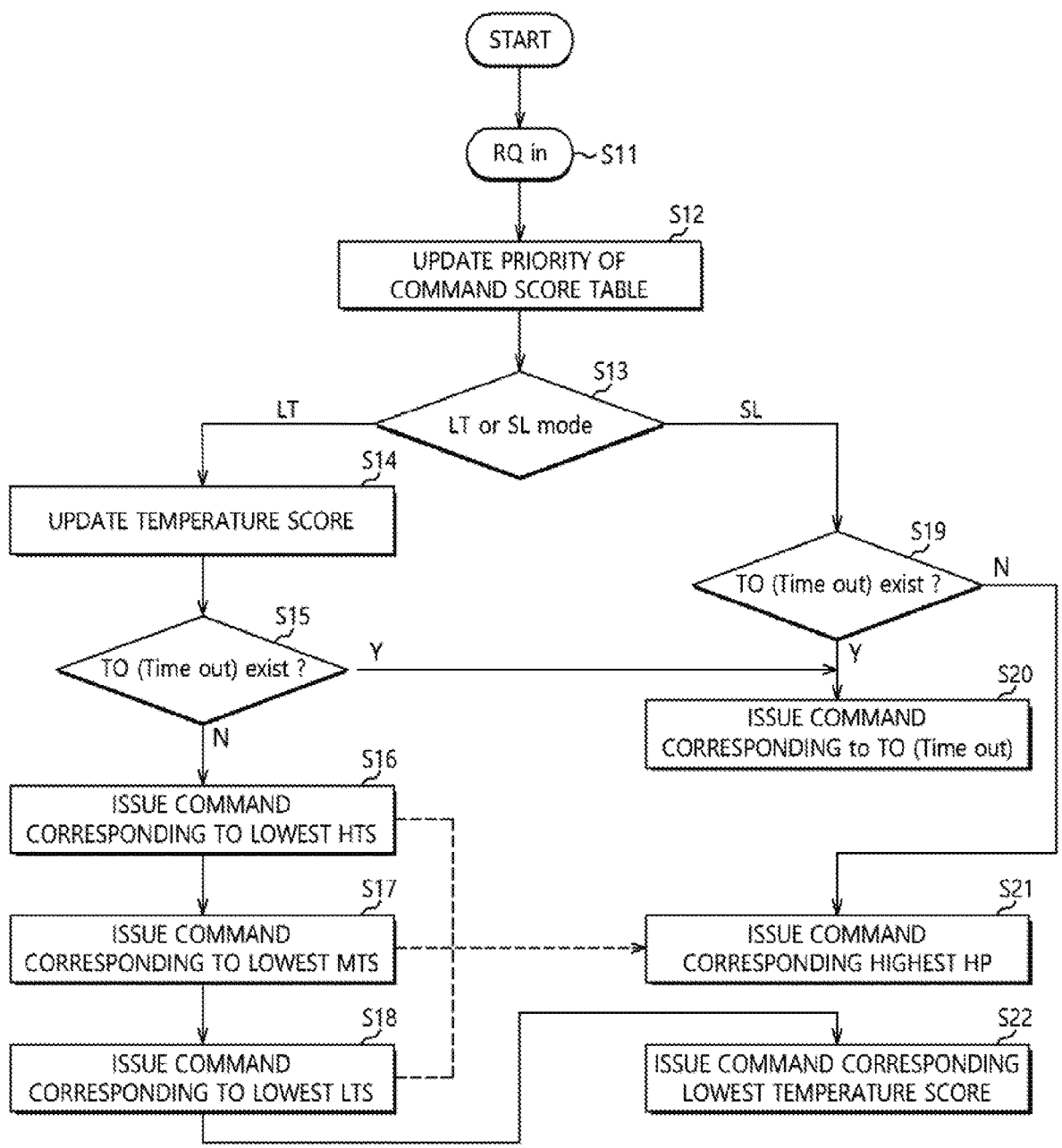
FIG. 10 is a diagram illustrating a command scheduling operation according to an embodiment of the present disclosure.

FIG. 10 is a diagram explaining a command scheduling operation according to an embodiment.

Referring to FIG. 10, when the request RQ is input from the host 2000 (S11), the memory controller may update the high priority HP item of the command score table (S12).

The memory controller may determine whether the operation mode of the memory system is the first operation mode LT or the second operation mode SL (S13).

As described above, the priority of scheduling commands in the first operation mode LT may be TO>HTS>MTS>LTS>HP and the priority of scheduling commands in the second operation mode SL may be TO>HP. The third operation mode may have the priority of TO>HTS>HP or TO>HTS>MTS>HP.

When the operation mode of the memory system is the first operation mode LT as a determination result in operation S13, the memory controller may update the temperature score included in the command score table by reading a temperature score corresponding to the decoded address among the temperature scores HTS, MTS, and LTS of the temperature score table (S14).

The memory controller may determine whether or not the time out TO item exists in the command score table, for example, the Time Out TO item is checked (S15).

When the time out TO item exists in the command score table as the determination result in operation S15, the memory controller may issue a command corresponding to the Time out TO item (S20).

When the Time Out TO item does not exist in the command score table as the determination result in operation S15, the memory controller may perform an operation of scheduling on commands for the temperature score HTS, MTS, and LTS items. First, the memory controller may issue a command corresponding to the lowest first temperature score HTS among queued commands (S16).

Subsequently, the memory controller may issue a command corresponding to the lowest second temperature score MTS among the queued commands (S17).

Then, the memory controller may issue a command corresponding to the lowest third temperature score LTS among the queued commands (S18).

The memory controller may issue the command corresponding to the lowest temperature score among the commands issued in operations S16 to S18 (S22).

After the commands are issued in operations S16 to S18, the memory controller may issue a command corresponding to the high priority HP item, for example, a command corresponding to the highest-scored priority (S21).

When the operation mode of the memory system is the second operation mode SL as the determination result in operation S13, the memory controller may determine whether or not the Time Out TO item exists in the command score table, for example, the Time Out TO item is been checked (S19).

When the Time Out TO item exists in the command score table as the determination result in operation S19, the memory controller may issue a command corresponding to the Time Out TO item (S20).

When the time out TO item does not exist in the command score table as the determination result in operation S19, the memory controller may issue a command corresponding to the high priority HP item, for example, a command corresponding to the highest-scored priority (S21).

The command scheduling method that the commands corresponding to all the temperature score HTS, MTS, and LTS items are issued and then the command corresponding to the high priority HP item is issued is illustrated in an embodiment. However, when the operation mode of the memory system is the third operation mode, the memory controller may issue commands by performing only partial operations S16 or S16 and S17 for the temperature score HTS and MTS items among the above-described operations S16 to S18 for the temperature score HTS, MTS, and LTS items and then the memory controller may issue the command corresponding to the high priority HP item (S21).

Figure 11:
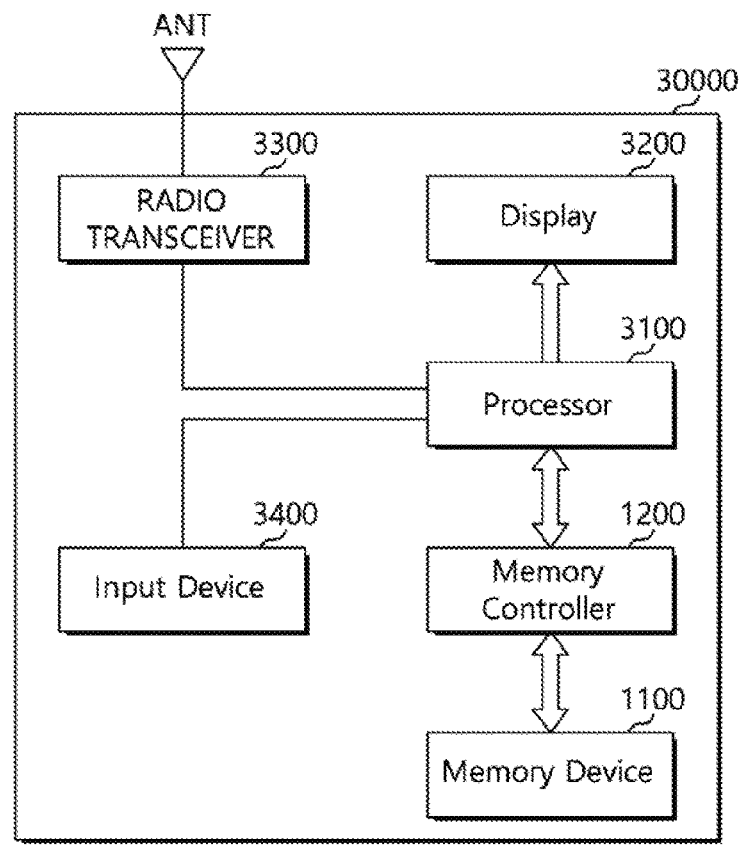
FIG. 11 is a diagram illustrating a configuration of an electronic system including a memory system including a memory controller illustrated in FIG. 1 according to an embodiment of the present disclosure.

FIG. 11 is a diagram illustrating a configuration of an electronic system including a memory system including the memory controllers illustrated in FIG. 1 according to an embodiment.

Referring to FIG. 11, an electronic system 30000 may be implemented with a cellular phone, a smart phone, a tablet personal computer (PC), a personal digital assistant (PDA), a wireless communication device, and the like.

The electronic system 30000 may include the memory system, a processor 3100, a display 3200, a radio transceiver 3300, and an input device 3400. The memory system may include the memory device 1100 or the memory device 1100' and the memory controller 1200 configured to control an operation of the memory device 1100 as illustrated in FIG. 1. The memory controller 1200 may control a data access operation to the memory device 1100 or memory device 1100', for example, a program operation, an erase operation, a read operation, and the like according to control of the processor 3100.

The data programmed in the memory device 1100 or memory device 1100' may be output through the display 3200 according to control of the memory controller 1200.

The radio transceiver 3300 may transmit and receive radio signals to and from an external device through an antenna ANT. For example, the radio transceiver 3300 may convert the radio signals received through the antenna ANT into signals to be processed in the processor 3100. The processor 3100 may process the signals output from the radio transceiver 3300 and transmit the processed signals to the memory controller 1200 or the display 3200. The memory controller 1200 may transmit the signals processed through the processor 3100 to the memory device 1100 or memory device 1100'.

The radio transceiver 3300 may change signals output from a host (not shown) into radio signals. The radio transceiver 3300 may change signals processed through the processor 3100 into radio signals and output the converted radio signals to the external device through the antenna ANT. The input device 3400 may be a device configured to input a control signal for controlling an operation of the processor 3100 or data to be processed through the processor 3100 and may be implemented with a pointing device such as a touch pad and a computer mouse, a key pad, a key board, and the like. The processor 3100 may control the operation of the display 3200 so that the data output from the memory controller 1200, the data output from the radio transceiver 3300, and the data output from the input device 3400 may be output through the display 3200.

Figure 12:
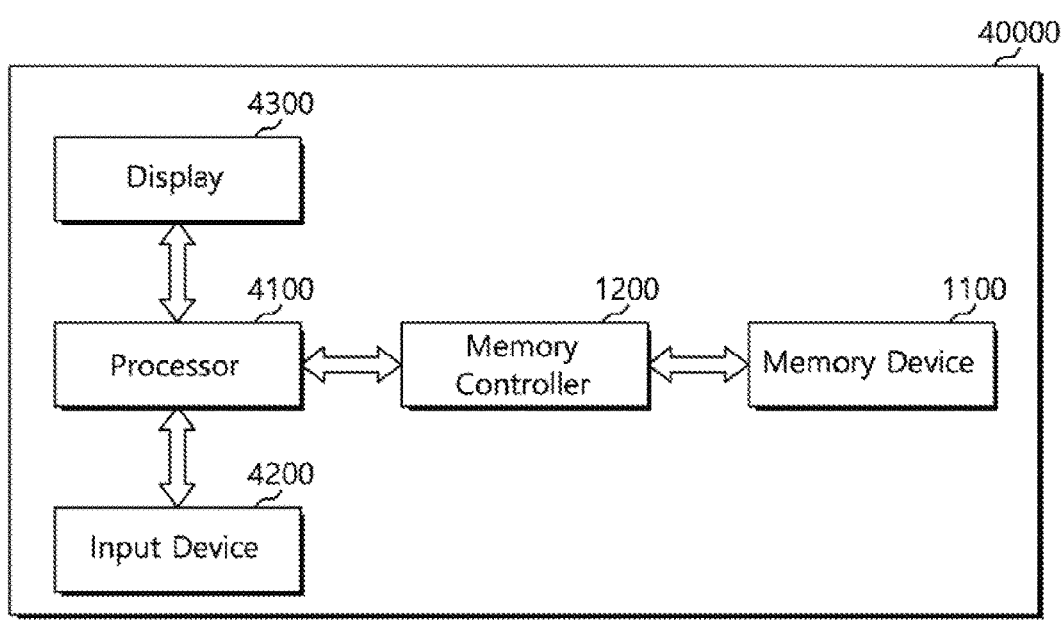
FIG. 12 is a diagram illustrating a configuration of an electronic system including a memory system including a memory controller illustrated in FIG. 1 according to an embodiment of the present disclosure.

FIG. 12 is a diagram explaining an electronic system including a memory system including the memory controller illustrated in FIG. 1 according to an embodiment.

Referring to FIG. 12, an electronic system 40000 may be implemented with a PC, a tablet PC, a net-book, an e-reader, a PDA, a portable multimedia player (PMP), an MP3 player, a MP4 player, and the like.

The electronic system 40000 may include the memory system, a processor 4100, an input device 4200, and a display 4300. The memory system may include the memory device 1100 or memory device 1100' and the memory controller 1200 configured to control a data processing operation of the memory device 1100 or memory device 1100' as illustrated in FIG. 1.

The processor 4100 may output data, which is stored in the memory device 1100 or memory device 1100' in accordance with data input through the input device 4200, through the display 4300. For example, the input device 4200 may be implemented with a pointing device such as a touch pad and a computer mouse, a key pad, a key board, and the like. The processor 4100 may control an overall operation of the electronic system 40000 and control an operation of the memory controller 1200.

Figure 13:
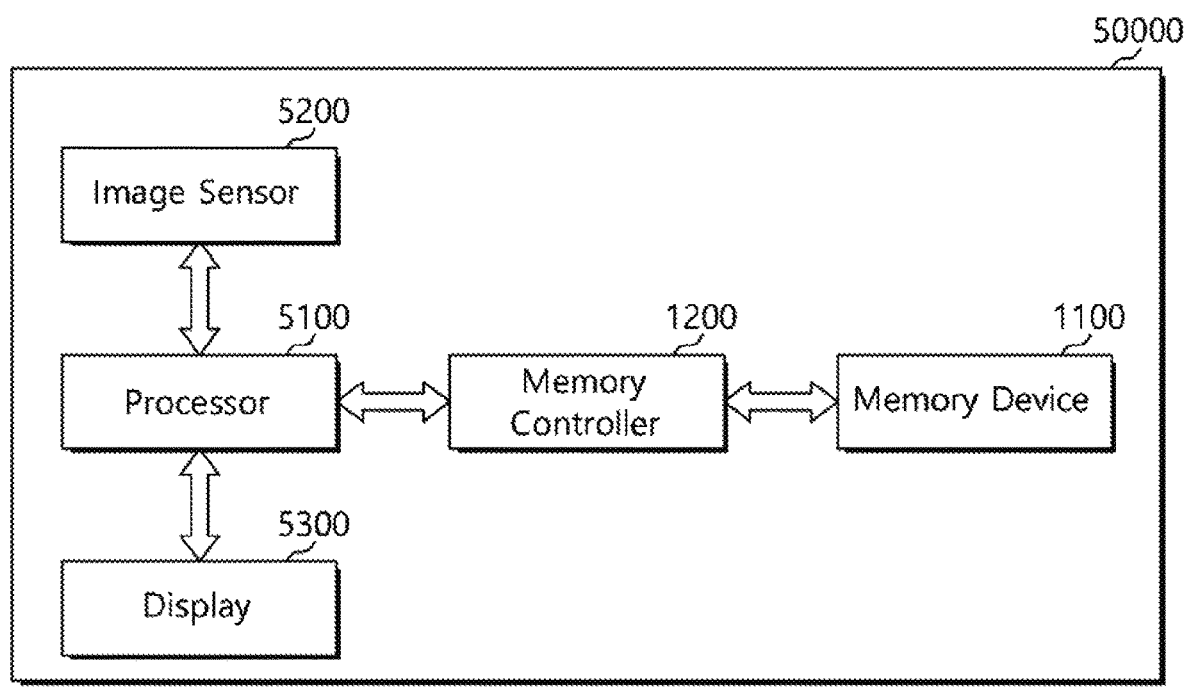
FIG. 13 is a diagram illustrating a configuration of an electronic system including a memory system including a memory controller illustrated in FIG. 1 according to an embodiment of the present disclosure.

FIG. 13 is a diagram explaining an electronic system including a memory system including the memory controller illustrated in FIG. 1 according to an embodiment.

Referring to FIG. 13, an electronic system 50000 may be implemented with an image processing device, such as a digital camera, a mobile phone to which a digital camera is attached, a smart phone to which a digital camera is attached, a table PC to which a digital camera is attached, and the like.

The electronic system 50000 may include the memory system, a processor 5100, an image sensor 5200, and a display 5300. The memory system may include the memory device 1100 or memory device 1100' and the memory controller 1200 configured to control a data processing operation, for example, a program operation, an erase operation, a read operation, and the like of the memory device 1100 or memory device 1100' as illustrated in FIGS. 1 and 3.

The image sensor 5200 in the data processing system 50000 may convert an optical image into digital signals and the converted digital signals may be transmitted to the processor 5100. The converted digital signals may be output through the display 5300 or stored in the memory device 1100 or memory device 1100' through the memory controller 1200, according to control of the processor 5100. The data stored in the memory device 1100 or memory device 1100' may be output through the display 5300 according to control of the processor 5100.

Figure 14:
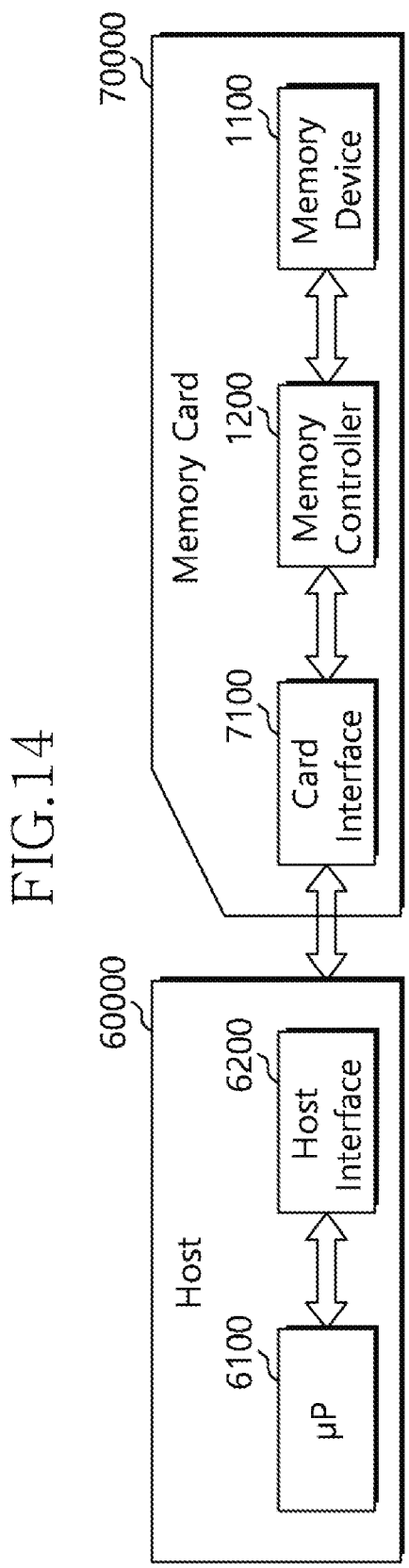
FIG. 14 is a diagram illustrating a configuration of an electronic system including a memory system including a memory controller illustrated in FIG. 1 according to an embodiment of the present disclosure.

FIG. 14 is a diagram explaining an electronic system including a memory system including the memory controller illustrated in FIG. 1 according to an embodiment.

Referring to FIG. 14, an electronic system 70000 according to an embodiment may be implemented with a memory card. The electronic system 70000 according to an embodiment may include the memory system and a card interface 7100. The memory system may include the memory device 1100 or memory device 1100' and the memory controller 1200 as illustrated in FIG. 1.

The memory controller 1200 may control data exchange between the memory device 1100 and the card interface 7100. According to embodiments, the card interface 7100 may be a secure digital (SD) card interface or a multi-media card (MMC) interface, but the card interface 7100 is not limited thereto. The card interface 7100 may interface data exchange between a host 60000 and the memory card (for example, the memory controller 1200) according to a protocol of the host 60000. According to embodiments, the card interface 7100 may support a UBS protocol, an interchip (IC)-USB protocol, and the like. The card interface 7100 may refer to hardware supporting a protocol used in the host 60000, software installed in the hardware, a signal transmission scheme, and the like.

The host 60000 may include a microprocessor (uP) 6100 and a host interface 6200. The microprocessor 6100 may control an overall operation of the host 60000 and communicate with the electronic system 70000 through the host interface 6200.

The above described embodiments are intended to illustrate and not to limit the present disclosure. Various alternatives and equivalents are possible. The disclosure is not limited by the embodiments described herein. Nor is the disclosure limited to any specific type of semiconductor apparatus. Other additions, subtractions, or modifications are obvious in view of the present disclosure and are intended to fall within the scope of the appended claims.

What is claimed is:

1. A memory controller comprising:
a temperature monitor configured to update temperature states of a memory device divided into groups as temperature scores; and
a scheduler configured to update a command score using the temperature scores and change a priority of the command score to match with a current operation mode,
wherein the temperature monitor includes:
an address decoder configured to decode an address generated according to an external request and output a decoded address;
a command decoder configured to decode a command generated according to the external request and output a decoded command; and
a temperature score generation circuit configured to update address count values as the temperature scores by dividing the address count values according to the groups of the memory device based on the decoded address and the decoded command.

2. The memory controller of claim 1, wherein the temperature score generation circuit includes a temperature score table, and
the temperature score table divides and stores the temperature scores according to the groups of the memory device which are divided into a high-level memory group, a middle-level memory group, and a low-level memory group.

3. The memory controller of claim 1, wherein the scheduler includes:
a command score generation circuit configured to generate the command score according to an address; and
a plurality of schedule circuits, each schedule circuit configured to issue a command corresponding to the priority of the command score changed according to a currently set operation mode among queued commands.

4. The memory controller of claim 3, wherein the command score includes temperature score items divided according to the groups of the memory device and a high priority item.

5. The memory controller of claim 4, wherein each of the plurality of schedule circuits is configured to issue the command corresponding to the priority of the command score according to its own temperature score among the temperature scores.

6. The memory controller of claim 4, wherein the scheduler is configured to operate by assigning a high-scored priority to the temperature score items among the temperature score items and the high priority item when the currently set operation mode is a first operation mode and operate by assigning the high-scored priority to the high priority item among the temperature score items and the high priority item when the operation mode is a second operation mode.

7. The memory controller of claim 6, wherein the scheduler is configured to operate by assigning a higher priority to partial temperature score items among the temperature score items than the high priority item and assigning a lower priority to remaining temperature score items among the temperature scores items than the high priority item.

8. A memory controller comprising:
a host interface configured to receive requests from a host and output data read from a memory device to the host; and
a command/address controller configured to update temperature states of the memory device and change an order in which commands are to be issued and provided to the memory device according to the temperature states and a currently set operation mode when the requests are received,
wherein the command/address controller includes:
a temperature monitor configured to update the temperature states of the memory device as temperature scores according to a count value; and
a scheduler configured to generate the count value by counting an address corresponding to each of the commands, update a command score using the temperature scores, and change a priority of each command score to match with the operation mode.

9. The memory controller of claim 8, wherein the temperature monitor includes:
an address decoder configured to decode an address generated according to each of the requests and output a decoded address; and
a command decoder configured to decode a command generated according to the each of the requests and output a decoded command; and
a temperature score generation circuit configured to update count values as the temperature scores by dividing the count values according to groups of the memory device based on the decoded addresses and the decoded commands.

10. The memory controller of claim 9, wherein the temperature score generation circuit includes a temperature score table, and
the temperature score table divides and stores the temperature scores according to the groups of the memory device which are divided into a high-level memory group, a middle-level memory group, and a low-level memory group.

11. The memory controller of claim 8, wherein the scheduler includes:
a command score generation circuit configured to generate each command score according to the corresponding address; and
a plurality of schedule circuits, each schedule circuit configured to issue a command corresponding to a priority of a command score changed according to the currently set operation mode among the commands to be provided to the memory device.

12. The memory controller of claim 11, wherein each command score includes temperature score items divided according to groups of the memory device and a high priority item.

13. The memory controller of claim 12, wherein each of the plurality of schedule circuits is configured to issue a command corresponding to a priority of a command score according to its own temperature score among the temperature scores.

14. The memory controller of claim 12, wherein the scheduler is configured to operate by assigning a high-scored priority to the temperature score items among the temperature score items and the high priority item when the operation mode is a first operation mode and operate by assigning the high-scored priority to the high priority item among the temperature score items and the high priority item when the operation mode is a second operation mode.

15. The memory controller of claim 14, wherein the scheduler is configured to operate by assigning a higher priority to partial temperature score items among the temperature score items than the high priority item and assigning a lower priority to remaining temperature score items among the temperature score items than the high priority item.

* * * * *